United States Patent [19]

Eddlemon

[11] Patent Number: 5,142,243
[45] Date of Patent: Aug. 25, 1992

[54] APPARATUS AND METHOD FOR AN INPUT STAGE OF AN OPERATIONAL AMPLIFIER

[75] Inventor: Dennis N. Eddlemon, Tucson, Ariz.

[73] Assignee: Apex Microtechnology Corporation, Tucson, Ariz.

[21] Appl. No.: 618,388

[22] Filed: Dec. 19, 1990

[51] Int. Cl.⁵ .............................................. H03F 3/45
[52] U.S. Cl. ................................... 330/253; 330/259; 330/260; 330/261
[58] Field of Search ................ 330/253, 258, 259, 260, 330/261, 311

[56] References Cited

PUBLICATIONS

Jaeger, "High-Performance Input Stage for Integrated Operational Amplifiers," IBM Technical Disclosure Bulletin, vol. 18, No. 6, Nov. 1975, pp. 1645, 1646.

*Primary Examiner*—James B. Mullins
*Attorney, Agent, or Firm*—William W. Holloway

[57] ABSTRACT

An operational amplifier input stage includes two transistors coupled as a differential amplifier to receive input signals. At least one transistor is stacked in a load circuit of each input transistor for the purpose of lowering the voltage across each transistor. In order to eliminate the effects of error currents resulting from conventional resistor self biasing of the stacked transistors, two nodes, to which the input transistors are coupled, are identified. A feedback circuit is coupled to each node and each feedback circuit maintains the coupled node at a voltage level established by the feedback apparatus of the operational amplifier. The disclosed circuit eliminates circuit drift and offset voltages resulting from changes in common mode and/or power supply voltages by eliminating the effects of resistive loading on the input stage components.

20 Claims, 2 Drawing Sheets

APPARATUS AND METHOD FOR AN INPUT STAGE OF AN OPERATIONAL AMPLIFIER

BACKGROUND OF THE INVENTION

1. Field of the Invention

This invention relates generally to the electronic circuits and, more particularly, to circuits that can be used as an input stage for an operational amplifier. The input stage, to which present invention has application, includes components coupled in series to increase the voltage rating of the stage. A feedback method is described which eliminates error currents in the differential stage, currents which would adversely affect the drift and the offset voltages as the power supply or the common mode voltage changes after the input stage has been calibrated for the initial conditions.

2. Description of the Related Art

Referring now to FIG. 1, an input stage for an operational amplifier, according to the prior art, having components coupled in series in a cascode configuration is shown. The negative terminal T1 of a power supply, which is shown coupled to the ground potential, is coupled to a first terminal of resistor R11 and to a first terminal of resistor R13. The second terminal of resistor R11 is coupled to a gate terminal of an enhancement mode MOSFET transistor Q12 and to a first terminal of resistor R12. The second terminal of resistor R12 is coupled to a first terminal of resistor R14 and to a drain terminal of transistor Q12. A second terminal of resistor R13 is coupled to a source terminal of an enhancement mode MOSFET transistor Q13. A drain terminal of transistor Q13 is coupled to a source terminal of transistor Q12. A second terminal of resistor R14 is coupled to a positive terminal T2 of a power supply. The SIGNAL IN for the stage is applied between the common terminal and a gate terminal of transistor Q13. The SIGNAL OUT $V_0$ is supplied between ground potential and the first terminal of resistor R14.

The circuit shown in FIG. 1 includes two (transistor) components, Q12 and Q13, coupled in series. However, any number of (transistor) components can be coupled in series using similar techniques. In addition, the common terminal, shown as being coupled to the ground potential, can be decoupled from the ground potential and be permitted to float electrically. The resistors R11 and R12 provide biasing for the transistors with the result that approximately one half of the supply voltage is applied across each resistor.

When an input signal applied to the input stage is changed, the voltage across transistors Q12 and Q13 will vary. The variation in the voltage across the two transistors Q12 and Q13 will result in variation in the current through resistors R11 and R12. The total stage current changes thereby and is dependent of the SIGNAL IN.

Referring next to FIG. 2, a simplified circuit diagram of a operational amplifier input stage wherein protection of the differential amplifier from excessive voltage is required. A negative voltage terminal T1 of a voltage supply is coupled to a first terminal of resistor R27, and a first terminal of resistor R26 and a negative terminal of V21. A second terminal of resistor R27 is coupled to source terminal of an enhanced mode metal oxide semiconductor field effect (MOSFET) transistor Q20 The positive terminal of power supply V21 is coupled to a gate of transistor Q20. A drain terminal of transistor Q20 is coupled to the source of enhanced mode MOS-FET transistor Q29. A second terminal of resistor R26 is coupled to a first terminal of resistor R25 and a gate terminal of transistor Q29. A second terminal of resistor R25 is coupled to a source terminal of field effect (FET) transistor Q27, a drain terminal of transistor Q29, a first terminal of resistor R28, and a source terminal of FET transistor Q28. A drain terminal of transistor Q27 is coupled to a first terminal of resistor R22 and to a source terminal of enhanced mode MOSFET transistor Q24. A drain terminal of transistor Q28 is coupled to a source terminal of enhanced mode MOSFET transistor Q26 and to a first terminal of resistor R24. A second terminal of resistor R28 is coupled to a gate terminal of transistor Q24, a gate terminal of transistor Q26 and a first terminal of current source I22. A second terminal of resistor R22 is coupled to a gate terminal of enhanced mode MOSFET transistor Q23 and to a first terminal of resistor R21. A drain terminal of transistor Q24 is coupled to a source terminal of Q23. A second terminal of resistor R24 is coupled to a gate terminal of enhanced mode MOSFET transistor Q25 and to a first terminal of resistor R23. A drain terminal of transistor Q25 is coupled to a second terminal of resistor R23 and to a collector terminal of pnp transistor Q22. The drain of transistor Q23 is coupled to a second terminal of resistor R21, to a collector terminal of pnp transistor Q21, to a base terminal of transistor Q21, and to a base terminal of transistor Q22. The positive voltage terminal T2 of the network power supply is coupled to an emitter terminal of transistor Q21, to an emitter terminal of transistor Q22, and to a second terminal of current source I22. Input signals ar applied to a gate terminal of transistor Q27 and to a gate terminal of transistor Q28. The output signal is obtained from the collector terminal of transistor Q22.

As will be clear to those skilled in the art, the stage current dependent on the SIGNAL IN in FIG. 1 can be reduced by increasing the resistor values R11 and R12 to arbitrarily high values. The higher the value of the resistors, the smaller the stage current dependence on the SIGNAL IN. However, the response of the circuit is compromised by this approach. The gate capacitance of transistor Q12 must be charged and discharged through the bias setting resistors, which because of the high values of resistance, limit the dynamic response. A sufficiently fast step alteration in the input signal can induce an unequal voltage distribution in the input circuit which can result in the destruction of the transistors. The present operational amplifier input circuit permits the values of resistance for the bias setting resistors to be sufficiently low to avoid damage to the transistors during dynamic operation while minimizing the variations in stage current.

In the operation of FIG. 2, the circuit prevents excessive voltage from being generated across the differential amplifier. The current through current source I22 established a constant and low voltage across transistors Q27 and Q28. The remaining supply voltage is distributed across the transistor pair Q23 and Q24, the transistor pair Q25 and Q26, and the transistor pair Q29 and Q20. With a zero common mode voltage, the gate terminal of transistor Q28 and the gate terminal Q27 are coupled to ground terminal (i.e., the applied voltage equals zero volts). With the zero common mode voltage, approximately one half of the supply voltage will be developed across the transistor pair Q23 and Q24 in the portion of the circuit coupled in series with transistor Q27 and approximately one half the supply voltage will be developed across the transistor pair Q25 and Q2 in the portion of the circuit coupled in series with the transistor Q28. The remaining half of the supply voltage will be developed across the transistor pair Q29 and Q20. One quarter of the supply voltage will be developed across each transistor of the transistor pairs. As the common mode voltage varies, the voltage developed across each transistor of the transistor pairs will vary. As in the circuit of FIG. 1, the current in the resistance divider networks will change, the change being reflected in the current through the differential amplifier (i.e., transistors Q27 and Q28). Whenever the current through the differential amplifier changes, the offset voltage and the drift characteristics of the input stage will change.

A need has been an input amplifier stage providing an extended input signal to an operational amplifier for which the offset voltage and the drift characteristics will be minimized for changes in the input common mode voltage and power supply voltage.

FEATURES OF THE INVENTION

It is an object of the present invention to provide an improved input stage for an operational amplifier.

It is a feature of the present invention to provide an improved operational amplifier input stage for an input stage requiring stacked transistor components to improve the input stage voltage rating.

It is another feature of the present invention to provide an improved input stage for an operational amplifier for which stage current variations due to biasing of stacked components in a differential amplifier input stage are reduced.

It is yet another feature of the present invention to provide an input stage for an operational amplifier which reduces the effect of changes in circuit drift and offset voltage due to common mode and power supply changes arising from biasing of stacked components.

SUMMARY OF THE INVENTION

The aforementioned and other features are attained, according to the present invention, by providing an operational amplifier input stage having two input transistors to have the input signals applied thereto. In the drain circuit of each input transistor includes two control transistors and a pnp load transistor. The source terminal of the input transistors are coupled to a common, serially coupled, pair of control transistors. A first node, coupled to the source terminals of the input transistors, and a second node, coupled to the drain terminals of the input transistors and to the first node through a resistor, are each coupled to a feedback circuit which maintains the node voltage at a constant level. The voltage levels of the first and second nodes are determined by the total feedback of the circuit of which the operational amplifier input stage is a part. The feedback circuits of the operational amplifier input stage establish the correct bias for the stacked components associated with the input transistors and the components of the feedback networks coupled thereto and eliminate stage current variations resulting from the loading by the resistor biasing network. In this manner, offset voltage and circuit drift due to stage current variations caused by the resistor biasing network are eliminated.

These and other features of the invention will be understood upon reading of the following description along with the drawings.

DESCRIPTION OF THE PREFERRED EMBODIMENT

1. Detailed Description of the Figures

Figure 3:
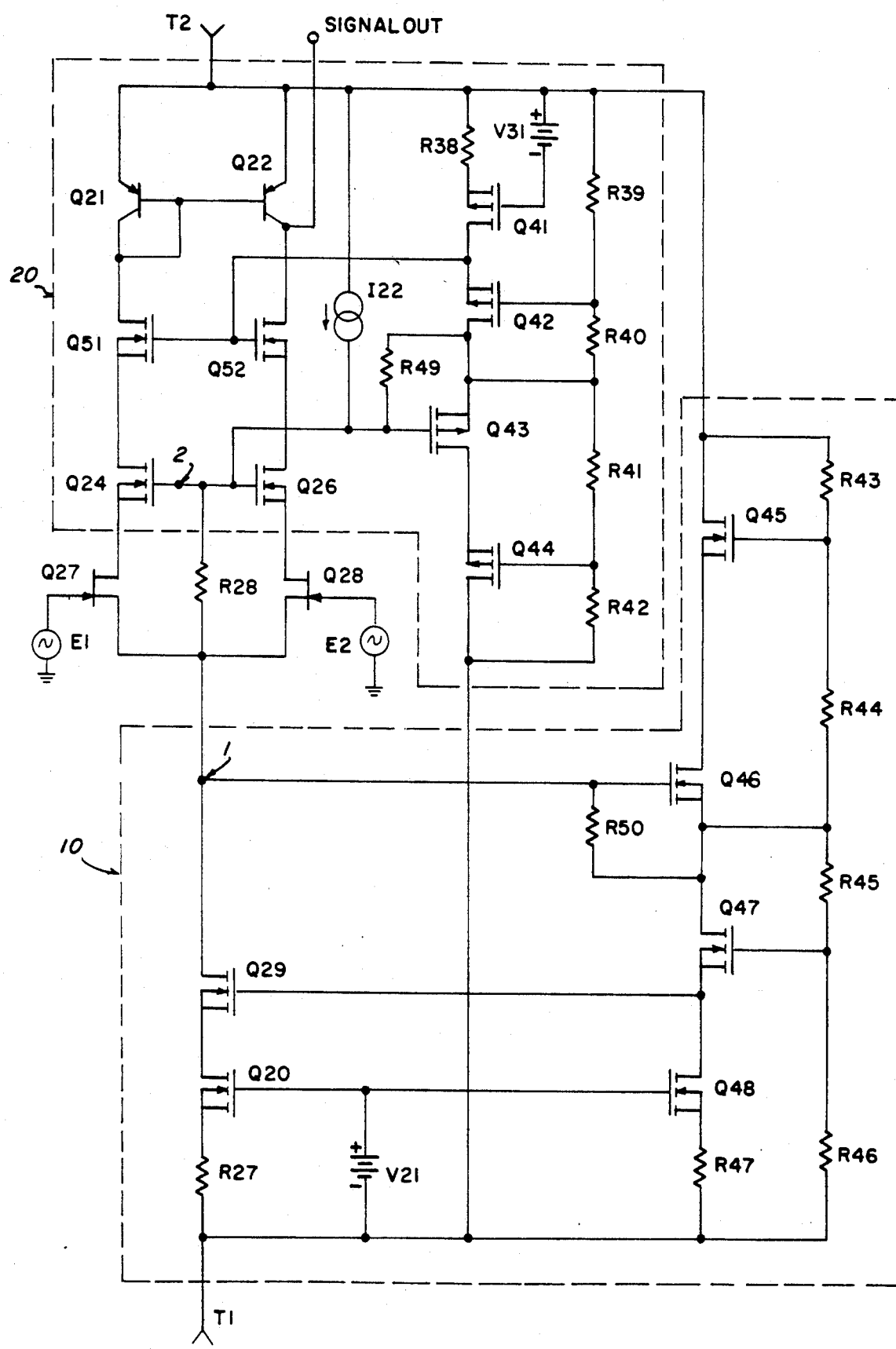
FIG. 3 is a schematic circuit diagram illustrating the technique for eliminating stage current variations in an input stage of an operational amplifier according to the present invention.

Referring now to FIG. 3, the operational amplifier input stage according to the present invention is shown. The positive supply terminal T2 is coupled to an emitter terminal of pnp transistor Q21, to an emitter terminal of pnp transistor Q22, to a first terminal of current source I22, to a positive terminal of supply V31, to a first terminal of resistor R38, to a first terminal of resistor R39, to a first terminal of resistor R43, and to a drain terminal of MOSFET transistor Q45. A collector terminal of transistor Q21 is coupled to the base terminal of transistor Q22, to the base terminal of transistor Q21, and to a drain terminal of MOSFET transistor Q51. The collector of transistor Q2 is coupled to the drain of MOSFET transistor Q52. A gate terminal of transistor Q51 is coupled to a gate terminal of transistor Q52, to a drain terminal of MOSFET transistor Q41 and to a source terminal of MOSFET transistor Q42. A source terminal of transistor Q41 is coupled to a second terminal of resistor R38, while a gate terminal of transistor Q41 is coupled to a negative terminal of power supply V31. A second terminal of resistor R39 is coupled to a gate terminal of transistor Q42 and to a first terminal of resistor R40. A drain terminal of transistor Q42 is coupled to a first terminal of resistor R49, to a second terminal of resistor R40, to a first terminal of resistor R41, and to a source terminal of MOSFET transistor Q43. A source terminal of transistor Q51 is coupled to a drain terminal of MOSFET transistor Q24, while a source terminal of transistor Q52 is coupled to a drain terminal of MOSFET transistor Q26. The gate terminal of transistor Q43 is coupled to a second terminal of resistor R49, a gate terminal of transistor Q24, a gate terminal of transistor Q26, a first terminal of resistor R28, and to a second terminal of current source I22. A source terminal of transistor Q24 is coupled to a drain terminal of n-channel transistor Q27. A source terminal of transistor Q26 is coupled to a drain terminal of n-channel transistor Q28. A source terminal of transistor Q27 is coupled to a source terminal of Q28, to a second terminal of resistor R28, to a drain terminal of MOSFET transistor Q29, to a first terminal of resistor R50 and to a gate terminal of MOSFET transistor Q46. A drain terminal of transistor Q43 is coupled to a source terminal MOSFET transistor Q44. A gate terminal of transistor Q44 is coupled to a second terminal of resistor R41 and to a first terminal of resistor R42. A drain terminal of transistor Q44 is coupled to a second terminal of resistor R42 and to the negative terminal T1 of the network power supply. A gate terminal of transistor Q45 is coupled to a second terminal of resistor R43 and a first terminal of resistor R44. A source terminal of transistor Q45 is coupled to a drain terminal of transistor Q46. A source terminal of transistor Q46 is coupled to a second terminal of resistor R44, to a first terminal of resistor R45, to a second terminal of resistor R50 and to a drain terminal of MOSFET transistor Q47. A gate terminal of transistor Q47 is coupled to a second terminal of resistor R45 and to a first terminal of resistor R46. A source terminal of transistor Q47 is coupled to a gate terminal of transistor Q29 and to a drain terminal of MOSFET transistor Q48. A source terminal of transistor Q48 is coupled to a first terminal of resistor R47. A source terminal of transistor Q29 is coupled to a drain terminal of MOSFET transistor Q20. A gate terminal of transistor Q20 is coupled to a positive terminal of power supply V21 and to a gate terminal of transistor Q48. A source terminal of transistor Q20 is coupled to a first terminal of resistor R27. The negative terminal of power supply V21 is coupled to a second terminal of resistor R27, to a negative terminal T1 of the network power supply, to a second terminal of resistor R47, and to a second terminal of resistor R46. A first input signal E1 is applied to a gate terminal of transistor Q27, while a second input signal E2 is applied to a gate terminal of transistor Q28. The signal out is taken from the collector terminal of transistor Q22.

2. Operation of the Preferred Embodiment

Figure 1:
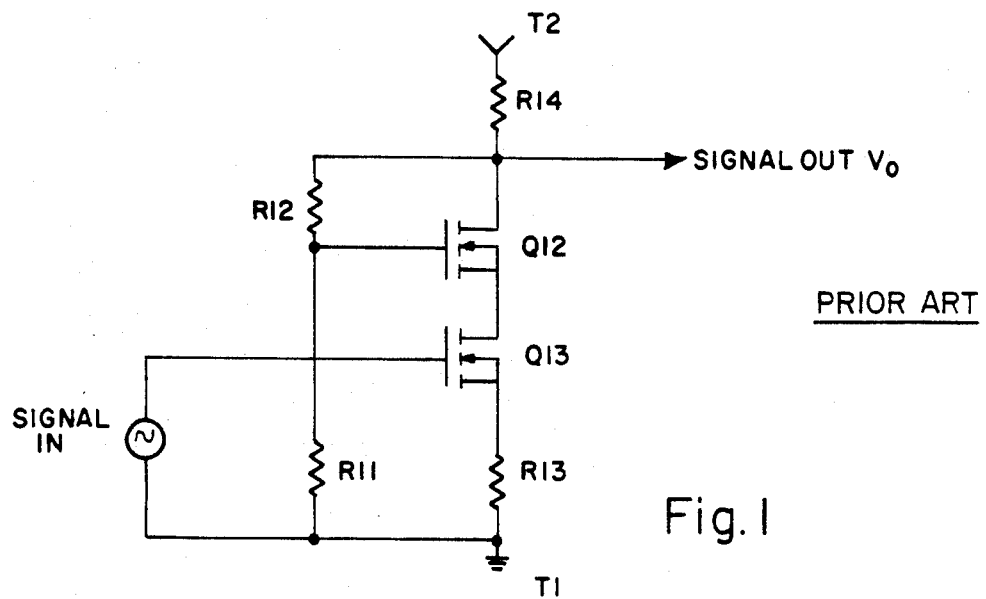
FIG. 1 is a schematic circuit diagram illustrating the biasing of stacked components and the dependence of stage current on an input signal for an operational amplifier input stage.
Figure 2:
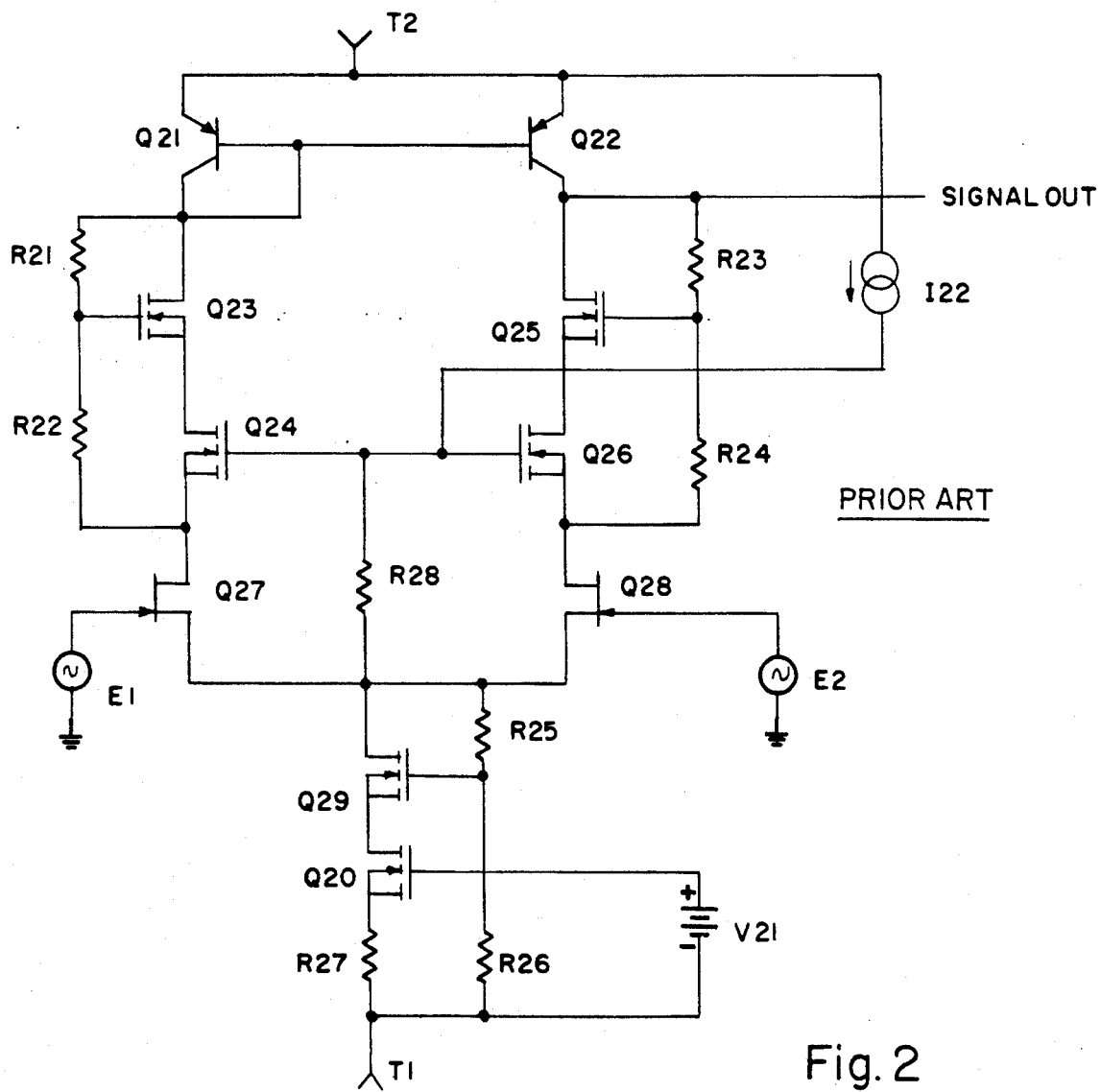
FIG. 2 is a schematic circuit diagram illustrating the generation of stage current variations in a prior art differential amplifier.

Referring once again to FIG. 3, two nodes, designated node 1 and node 2, are shown. In order to compensate for the problems described with relationship to the circuit of FIG. 2, two feedback loops are required. Each feedback loop is associated with a node of the circuit in FIG. 3. The portion of the circuit of FIG. 3 enclosed by the dotted lines and labelled circuit portion 10 is associated with the node 1. The portion of the circuit of FIG. 3 which is associated with node 2 is labelled 20. The operation of both circuits is similar, so that only the operation of circuit portion 10 will be described. The function of the feedback circuits is to establish the correct biasing of the stacked components once node voltages 1 and 2 are established by the overall (operational amplifier) circuit feedback apparatus. The voltage levels of the nodes cause the feedback circuits to establish the correct biases on the components of the input stage and on the components comprising the feedback circuits. In this manner, input stage current variations resulting from the loading effect of the resistor biasing network can be eliminated.

Transistor Q46 is coupled as a source follower component, a component which transfers the voltage of node 1 to the connection of resistor R44 and resistor R45. The voltage applied to the connection of resistor R44 and resistor R45 is divided (equally) by resistor R45 and resistor R46, the connection of resistor R45 and resistor R46 being coupled to the gate of transistor Q47. The source terminal of transistor Q47 is approximately at the same voltage as the gate terminal of transistor Q47, the source terminal being coupled to the gate terminal of transistor Q29. The voltage applied to the gate terminal of transistor Q29 provides the proper bias for the node 1 voltage to be divided equally across the transistors Q29 and Q20. The node 1 voltage is also equally divided across transistor Q47 and transistor Q48. Transistor Q48 provides a current source which supplies the additional current required when the common mode voltage changes and a different current is required in the resistor string consisting of resistor R43, resistor R44, resistor R45, and resistor R46. Four transistors, transistor Q45, transistor Q46, transistor Q47, and transistor Q48 are required since the entire supply voltage could be distributed across the Q45, Q46 transistor pair or could be distributed across the the Q47, Q48 transistor pair as the common mode voltage varies across the entire range or when the supply voltage is asymmetrical (i.e., with respect to ground).

The gate terminal resistor R49 and the gate resistor R50 provide part of a resistor bridge, resistors R39, R40, R41, and R42 in one leg of the leg of the resistor bridge and resistors R43, R44, R45, and R46 in a second leg of the resistor bridge between terminal T2 and terminal T1 of the power supply. Resistors R49, R28, and R50 are connected between the center points of the of the legs of the resistor bridge network. The resistor bridge network is purposely unbalanced to provide for a flow of current between the two branches of the resistor bridge network. The voltage thus developed across resistors R49 and R50 determines initial voltage to be applied to the gates of transistors Q43 and Q46, thereby providing the initial conditions for the circuit during start-up and preventing lock-up of the feedback circuits in a state non-responsive to input conditions.

While the feedback circuits of the operational amplifier input stage is generally shown as being implemented with enhancement mode MOSFET transistors, it will be clear that depletion mode MOSFET transistors or bipolar transistors could be employed.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. An input stage for an operational amplifier circuit, said input stage having reduced offset voltage and circuit drift due to changes in the power supply and common mode voltages changes while limiting voltages applied across transistors of said input stage, said input stage comprising:
   a pair of transistors coupled as a differential amplifier for receiving input signals;
   a bias resistor, said bias resistor having a first terminal coupled between a common terminal of said pair of transistors, said bias resistor having a second terminal coupled to load terminals of said pair of transistors;
   a first feedback circuit responsive to a voltage of said first bias resistor terminal and to a first voltage level determined by a power supply for determining a voltage of said first bias resistor terminal; and
   a second feedback circuit responsive to a voltage of said second terminal and to a second voltage level determined by said power supply for determining a voltage of said second bias resistor terminal.

2. The input stage of claim 1 wherein said differential amplifier includes:
   a first and a second serially-coupled transistor coupled between said first bias resistor terminal and a first terminal of a power source; and
   wherein said first feedback circuit includes:
      a first set of serially coupled transistors, said first set of transistors coupled between said first power supply terminal and a second power supply terminal; and a first set of serially coupled resistors coupled between said first and said second power supply terminals; wherein said first set of resistors provide bias voltages for selected first set transistors, said first set transistors being interconnected with said first and said second transistors.

3. The input stage of claim 2 wherein a first differential amplifier transistor includes a third and a fourth transistor coupled between a load terminal of said first differential amplifier transistor and said second power supply terminal, a second differential amplifier transistor having a fifth and sixth transistor coupled between a load terminal thereof and said second power supply terminal; and second feedback circuit including:
 a second set of serially coupled resistors coupled between said first and said second power supply terminals; and
 a second set of serially coupled transistors coupled between said first and said second power supply terminals, wherein said second set of resistors provides bias voltages for selected second set transistors, said second set transistors being interconnected with said third and fourth and said fifth and sixth transistors.

4. The input stage of claim 3 further including a first and a second initial bias transistor, said first and said second initial bias transistor coupled to provide third set of serially-coupled resistors coupled between said first and said second power supply terminals, said third set of resistors including said bias resistor.

5. The input stage of claim 3 wherein said first, second, third, fourth, fifth, and sixth transistors and transistors of said first and said second set of transistors are enhancement mode MOSFET transistors.

6. The input stage of claim 3 wherein said second terminal of said bias resistor is coupled to a control terminal of said third transistor, a control terminal of said fifth transistor, and a control terminal of a first transistor of said second transistor set.

7. The input stage of claim 6 wherein said bias resistor first terminal is coupled to a control terminal of a first first set transistor, a second first set transistor being coupled to a control terminal of said first transistor.

8. A method of reducing the offset voltage and circuit drift due to changes in the power supply and common mode voltages changes of an input stage of an operational amplifier while limiting voltages applied across transistors of said input stage, said method comprising the steps of:
 coupling a first transistor and a second transistor as a differential amplified, said differential amplifier including a bias-setting resistor coupled across said first and said second transistors, load terminals of said first and said second transistors each having a first and a second plurality of serial-coupled load transistors respectively coupled thereto, a common terminal of said first and second transistors having a third plurality of series-coupled bias transistors coupled thereto;
 maintaining a first terminal of said bias-setting resistor at a first constant voltage using a first feedback circuit responsive to a voltage level of said first terminal and a first ratio of a power supply voltage, said first feedback circuit applying a control signal to a bias transistor; and
 maintaining a second terminal of said bias-setting resistor at a second constant voltage using a second feedback circuit responsive to a voltage level of said second terminal and to a second ratio of said power supply voltage, said second feedback circuit applying a control signal to a load transistor, wherein said second constant voltage is determined by said feedback of said operational amplifier.

9. The method of claim 8 wherein said differential amplifier first and second plurality of load transistors are coupled to a second power supply terminal, said third plurality of transistors coupled to a first power supply terminal, wherein said maintaining a second terminal step includes the step of interconnecting a fourth plurality of transistors coupled in series between said first power supply terminal and said second power supply terminal with said first and said second plurality of transistors, and wherein said maintaining a first terminal step includes the step of interconnecting a fifth plurality of transistors coupled in series between said first supply terminal and said second supply terminal with said third plurality of transistors.

10. The method of claim 9 further including the step of:
 providing bias voltages for said fourth plurality of transistors using a first plurality of resistors coupled in series between said first power supply terminal and said second power supply terminal; and
 providing a bias voltage for said fifth plurality of transistors using a second plurality of resistors coupled in series between said first power supply terminal and said second power supply terminal.

11. The method of claim 10 wherein said coupling step further includes the step of coupling a current source to said second terminal of said bias-setting resistor.

12. The method of claim 11 wherein said coupling step further includes the step of coupling said first terminal of said bias-setting resistor to a first first plurality transistor control terminal, to a first second plurality transistor control terminal, and to a first fourth plurality transistor control terminal.

13. The method of claim 12 further comprising the step of implementing said fourth and fifth plurality of transistors with enhancement mode MOSFET transistors.

14. An input stage for an operational amplifier, said input stage comprising:
 a first circuit node;
 a second circuit node;
 a bias resistor coupled between said first and said second nodes;
 a first and a second input transistor, said first and second input transistor coupled between said first and said second node;
 a first plurality of transistors coupled between said first input transistor and a second power supply terminal;
 a second plurality of transistors coupled between said second input transistor and said second power supply terminal;
 a third plurality of transistors coupled between said first and second input transistors and a first power supply terminal;
 a current source coupled to said bias resistor;
 a first feedback circuit interconnected with said first and said second plurality of transistors, said first feedback circuit maintaining said second node at a constant voltage; and
 a second feedback circuit interconnected with said third plurality of transistors, said second feedback circuit maintaining said first node at a constant voltage;

wherein said first and said second feedback circuits each include a fourth plurality of transistors and a fifth plurality of transistors, respectively, coupled in series between said first and said second power supply terminal; said first and said second feedback circuits including a first and a second plurality of resistors, respectively, coupled in series between said first and said second power supply terminals.

15. The input stage of claim 14 wherein said first and said second feedback circuit transistors are enhancement mode MOSFET transistors.

16. The input stage of claim 15 further comprising initialization resistors for initializing input stage transistors with predetermined voltage levels.

17. The input stage of claim 14 wherein each plurality of feedback circuit resistors provides bias voltages for an associated plurality of feedback circuit transistors.

18. The input stage of claim 14 wherein said second node is connected to said current source, to a control terminal of a one of said first plurality of transistors, to a control terminal of a one of said second plurality of transistors, and to a control terminal of a one of said fourth plurality of transistors.

19. The input stage of claim 18 wherein said first node is coupled to a control terminal of a one of said fifth plurality of transistors.

20. The input stage of claim 14 wherein said first and said second feedback circuit transistors are depletion mode MOSFET transistors.

* * * * *